US012463072B2

(12) United States Patent
Li et al.

(10) Patent No.: US 12,463,072 B2
(45) Date of Patent: Nov. 4, 2025

(54) HASH OVERHEAD HOIST TRANSPORT RAIL SYSTEM AND METHODS OF OPERATING THE SAME

(71) Applicant: Taiwan Semiconductor Manufacturing Company, Ltd., Hsinchu (TW)

(72) Inventors: Guancyun Li, Miaoli County (TW); Ching-Jung Chang, Taichung (TW); Chi-Feng Tung, Miaoli County (TW); Hsiang Yin Shen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 954 days.

(21) Appl. No.: 17/586,448

(22) Filed: Jan. 27, 2022

(65) Prior Publication Data

US 2022/0406638 A1 Dec. 22, 2022

Related U.S. Application Data

(60) Provisional application No. 63/211,632, filed on Jun. 17, 2021.

(51) Int. Cl.
*B61J 1/06* (2006.01)
*B61B 3/00* (2006.01)
(Continued)

(52) U.S. Cl.
CPC .......... *H01L 21/67715* (2013.01); *B61B 3/00* (2013.01); *B61J 1/06* (2013.01);
(Continued)

(58) Field of Classification Search
CPC .......... H01L 21/67733; H01L 21/67715; B61J 1/06; B65G 9/008; E01B 25/26; B61L 23/002
See application file for complete search history.

(56) References Cited

U.S. PATENT DOCUMENTS

| 768,239 | A | * | 8/1904 | Richards | ................ B65G 9/008 104/99 |
| 2,360,505 | A | * | 10/1944 | Medenwald | .............. B66C 7/00 212/331 |

(Continued)

FOREIGN PATENT DOCUMENTS

| CN | 103693445 A | 4/2014 |
| CN | 104876014 A | 9/2015 |

(Continued)

OTHER PUBLICATIONS

Office Action issued in connection with Taiwan Appl. No. 111109494 dated Aug. 8, 2023.

(Continued)

*Primary Examiner* — Zachary L Kuhfuss
(74) *Attorney, Agent, or Firm* — FOLEY & LARDNER LLP

(57) ABSTRACT

An automated material handling system (AMHS) and a method of operating the AMHS are disclosed. In one aspect, the AMHS includes a network of rails and a vehicle configured to hold a sample carrier that stores one or more samples, wherein the vehicle is configured to move within the FAB via the network of rails. The AMHS also includes a turn table connected to the network of rails and configured to rotate about an axis substantially perpendicular to a surface of the turn table. The AMHS further includes a hash rail connected to and overlapping the turn table. The hash rail is configured to rotate about the axis with the turn table.

20 Claims, 13 Drawing Sheets

(51) Int. Cl.
  *B61L 23/00* (2006.01)
  *B65G 9/00* (2006.01)
  *B66C 19/00* (2006.01)
  *E01B 25/26* (2006.01)
  *H01L 21/67* (2006.01)
  *H01L 21/677* (2006.01)

(52) U.S. Cl.
  CPC ............ *B61L 23/002* (2013.01); *B65G 9/008* (2013.01); *B66C 19/00* (2013.01); *E01B 25/26* (2013.01); *H01L 21/67259* (2013.01); *H01L 21/67724* (2013.01); *H01L 21/6773* (2013.01); *H01L 21/67733* (2013.01); *E01B 2202/024* (2013.01); *H01L 21/67727* (2013.01)

(56) References Cited

U.S. PATENT DOCUMENTS

| | | | |
|---|---|---|---|
| 6,990,721 B2 * | 1/2006 | Mariano | H01L 21/67727 414/940 |
| 2005/0095087 A1 | 5/2005 | Sullivan et al. | |
| 2007/0186799 A1 | 8/2007 | Kyutoku et al. | |
| 2009/0288931 A1 * | 11/2009 | Oshima | H01L 21/67706 198/607 |
| 2013/0313070 A1 * | 11/2013 | Ogawa | B66B 3/00 198/370.01 |
| 2017/0128313 A1 * | 5/2017 | Glukhovsky | B60M 1/32 |

FOREIGN PATENT DOCUMENTS

| | | | | |
|---|---|---|---|---|
| CN | 107039321 A | | 8/2017 | |
| CN | 107758254 A | * | 3/2018 | ............ B65G 35/00 |
| DE | 24 56 363 A1 | | 6/1976 | |
| DE | 34 23 916 A1 | | 1/1986 | |
| KR | 101436905 B1 | | 11/2014 | |
| NO | 20020583 | | 2/2002 | |
| TW | 201925054 A | | 7/2019 | |
| TW | 202009200 A | | 3/2020 | |
| WO | WO-2018/037762 A1 | | 3/2018 | |

OTHER PUBLICATIONS

Office Action issued in connection with Chinese Appl. No. 202210505727.X dated Jun. 15, 2024.
Office Action issued in connection with Chinese Appl. No. 202210505727.X dated Feb. 20, 2025.

\* cited by examiner

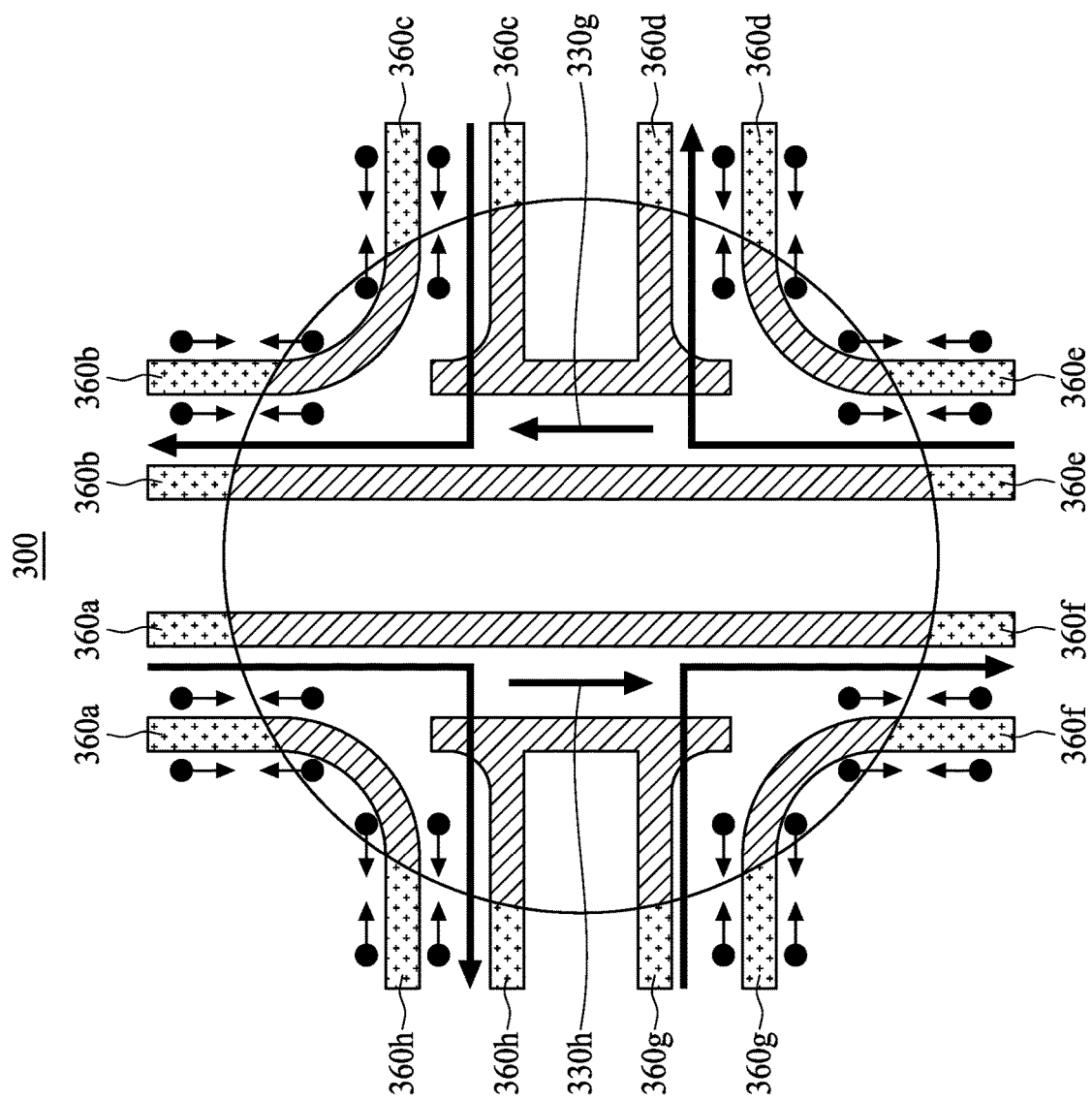

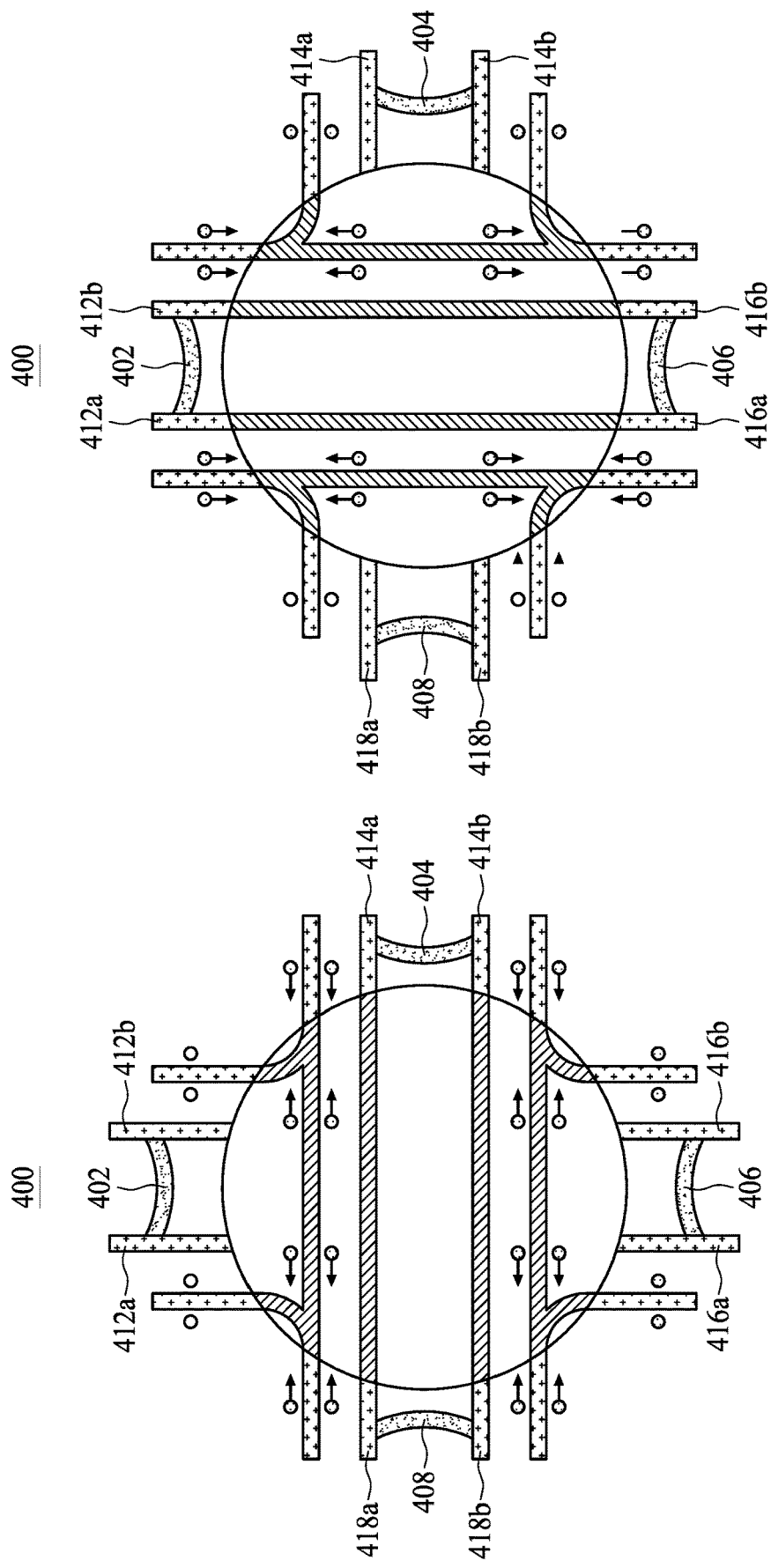

HASH OVERHEAD HOIST TRANSPORT RAIL SYSTEM AND METHODS OF OPERATING THE SAME

CROSS-REFERENCE TO RELATED APPLICATION(S)

This application claims priority to and the benefit of U.S. Provisional Application No. 63/211,632, filed Jun. 17, 2021, entitled "HASH OHT RAIL," which is incorporated herein by reference in its entirety for all purposes.

TECHNICAL FIELD

The present disclosure generally relates to semiconductor manufacturing facilities, and more particularly to overhead hoist transport systems used in such facilities.

BACKGROUND

Automated Material Handling Systems (AMHS) have been widely used in semiconductor fabrication facilities (FABs) to automatically handle and transport wafers and other samples between various processing machines ("tools") used in chip manufacturing. A typical FAB may include one or more floors having a plurality of process bays including processing tools and wafer staging equipment which are interconnected by the AMHS. A semiconductor FAB may include numerous types of automated and manual vehicles for moving and transporting sample carriers throughout the FAB during the manufacturing process. These may include for example automatic guided vehicles (AGVs), personal guided vehicles (PGVs), rail guided vehicles (RGVs), overhead shuttles (OHSs), and overhead hoist transports (OHTs).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3B illustrates a top view of the hash rail of FIG. 3A rotated by about 90 degrees, in accordance with some embodiments.

FIG. 4A illustrates a top view of an example hash rail and surrounding fixed rails, in accordance with some embodiments.

FIG. 4B illustrates a top view of the hash rail of FIG. 4A rotated by about 90 degrees, in accordance with some embodiments.

DETAILED DESCRIPTION

Figure 1:
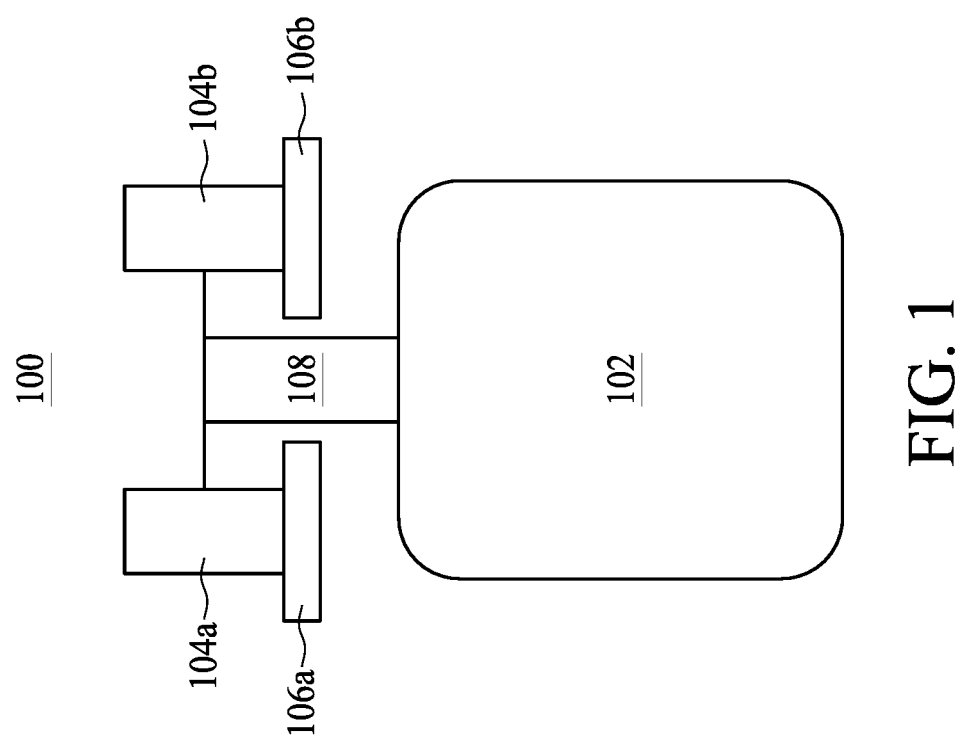
FIG. 1 illustrates a block diagram of a vehicle of an AMHS, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated about 90 degrees or at other orientations) and the spatially relative descriptors used herein may likewise be interpreted accordingly.

An OHT system automatically moves OHT vehicles (hereinafter also called "vehicles" or "transport vehicles") that carry and transport sample carriers, such as standard mechanical interface (SMIF) pods or front opening unified pods (FOUPs) holding multiple wafers or other samples (e.g., a photomask), from a processing or metrology tool or a stocker to the load port of another tool or other apparatus in the FAB. The OHT system may be used to transport vehicles within each bay (intra-bay) or between bays (inter-bay). The OHT system also moves empty vehicles (e.g., without a carrier) to a tool loadport or other apparatus for receiving and removing empty or full SMIF pods or FOUPs that may contain wafers for further transport and/or processing in other tools.

A typical FAB has a large network of rails that allow the vehicle to travel in one direction. The vehicle is typically not able to change directions such as make turns or turn around (e.g., U-turns), unless there are dedicated fixed rails that allow the vehicle to change directions. This causes longer travel times for the vehicles which lead to longer process times for semiconductor devices. Furthermore, a typical AMHS is prone to running into traffic jams because there are many vehicles that travel around the FAB on the AMHS and the vehicles are limited in the number of routes they can take.

In the present disclosure, embodiments of an AMHS allows vehicles to change directions. A hash rail installed in the AMHS is able to rotate about an axis so that an incoming vehicle can make a turn or let the vehicle pass through the hash rail. The hash rail can have a π (pi)-shape that assists the vehicle in changing directions. The hash rail can also be powered by a separate power supply than the rest of the network of rails to advantageously prevent dangerous collisions and malfunctions in the event of accidents. The hash rail can also include a plurality of sensors (e.g., geospatial sensors and/or alignment sensors) that detect the position of the hash rail, the location of the vehicle, alignment of the vehicle with respect to the hash rail, and automatically rotate as needed so that the vehicle can move to the designated destination. Accordingly, embodiments in the present disclosure can advantageously reduce travel times for the vehicles so that the semiconductor devices can be fabricated quicker and increase yield for FABs. Furthermore, the disclosed AMHS can reduce the likelihood of traffic jams by providing more options for vehicles to move around the AMHS. For example, embodiments of the present disclosure can increase inter-bay transfer capacity by 20% and reduce traffic jam by 15%. Also, the embodiments can enhance delivery time on average (DTA) by 10%. Furthermore, the embodiments can be applied to current and future technology nodes.

FIG. 1 illustrates a block diagram of an OHT vehicle ("vehicle") 100 of an AMHS, in accordance with some embodiments. The vehicle 100 can include a carrier 102, wheels 104a and 104b, and a shaft 108. The vehicle 100 of FIG. 1 can operate on a 4-rail AMHS, but embodiments are not limited thereto, and a vehicle that can operate on a 2-rail AMHS is contemplated within the disclosure.

The carrier 102 can include a sample carrier that is used to store one or more samples (e.g., wafers, photomasks, photoresists, deposition materials, etching materials, etc. and any other material that can fit within the vehicle 100) that are transported throughout the FAB. When the carrier 102 is holding wafers, the carrier 102 can store one or more wafers having a about 300 mm, about 390 mm, about 400 mm, or about 500 mm radius, but embodiments are not limited thereto. The wheels 104a and 104b can roll on a first rail 106a and a second rail 106b, respectively, and move the carrier 102 around the AMHS in the FAB. The shaft 108 connects the carrier 102 to the wheels 104a and 104b through an axel. Although certain components of the vehicle 100 is shown, embodiments are not limited thereto, and there can be more or fewer components to the vehicle 100. For example, the vehicle 100 can include a power receiver for wirelessly (e.g., contactless) receiving power through electromagnetic induction. Although not shown, the vehicle 100 can be connected to a controller that can control a movement of the vehicle 100. The controller can keep track of what kind of sample is in the carrier 102 and the location of the vehicle 100 within the FAB so that the controller knows where carrier 102 needs to go. Furthermore, although the present disclosure refers to a 4-rail AMHS and a 2-rail AMHS, embodiments are not limited thereto and a portion (s) of the AMHS can be 4-rail and a portion(s) of the AMHS can be 2-rail. In this disclosure, a 2-rail AMHS refers to an AMHS including a network of rails that have one method (or path) of going in one direction, and another method of going in the opposite direction. For example, referring to an AMHS 600 of FIGS. 6A-6B, the vehicle moving along the fixed and hash rails in the AMHS 600 can only travel in a particular direction in one way. Each rail still includes a pair of rails (e.g., rails 106a and 106b) on which one vehicle (e.g., vehicle 100) can place its wheels 104a and 104b. A 4-rail AMHS refers to an AMHS including a network of rails that have two methods of going in one direction, and another two methods of going in the opposite direction. For example, referring to an AMHS 500 of FIGS. 5A-5B, two methods of traveling in each direction are shown. More details on the AMHS 500 and AMHS 600 are described below.

Figure 2:
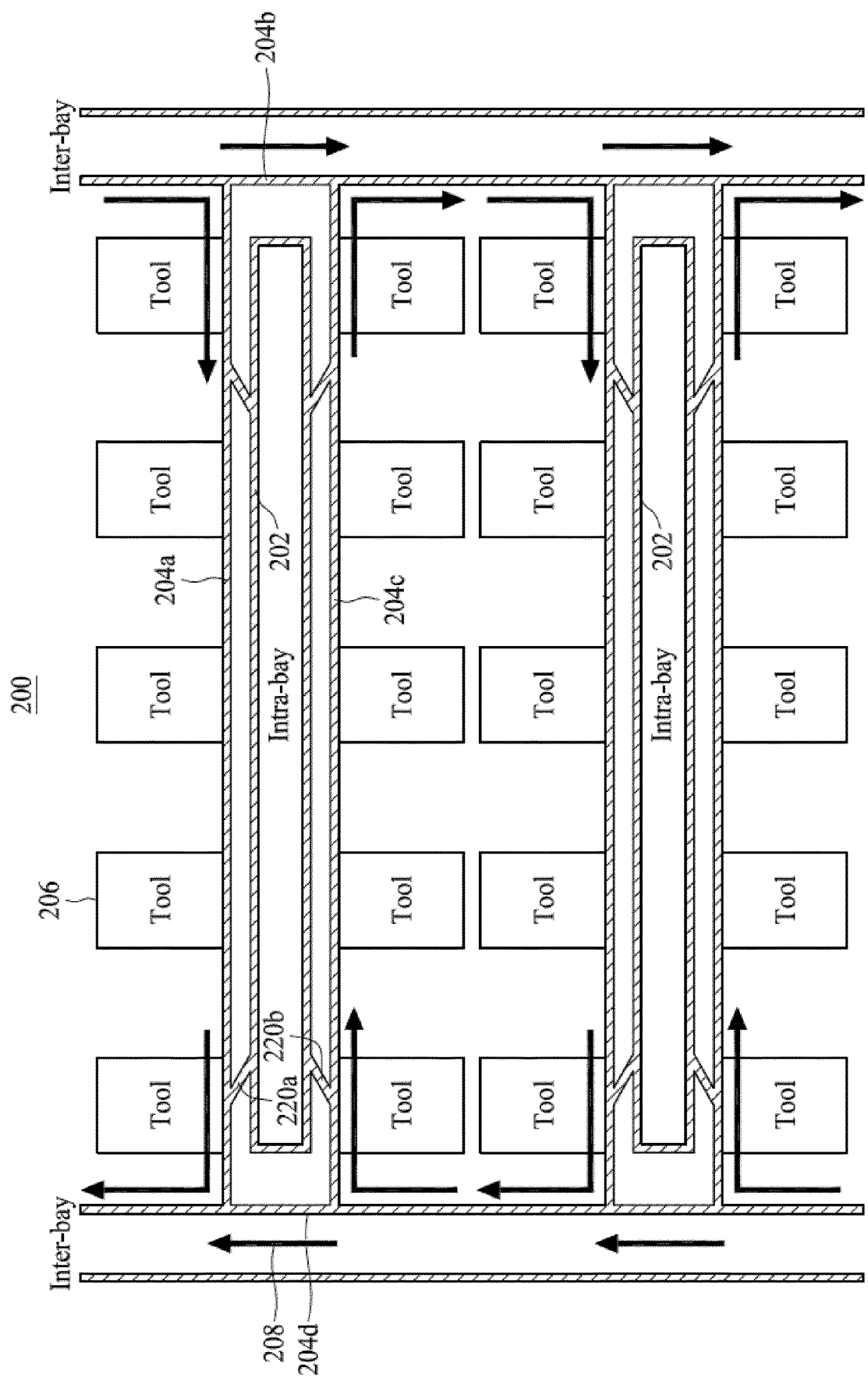
FIG. 2 illustrates a schematic layout diagram of an example FAB including an AMHS, in accordance with some embodiments.

FIG. 2 illustrates a schematic layout diagram of an example FAB including an AMHS 200, in accordance with some embodiments. The AMHS 200 includes a network of OHT rails (hereinafter called "rails") that are connected to one another, including outer loops (or outer track) 204 and inner loops (or inner track) 202. A vehicle (e.g., vehicle 100) can move throughout the FAB using the rails to various tools 206.

The inner loop 202 includes a loop around an intra-bay. The inner loop 202 allows a vehicle to move around the intra-bay without having to move or transfer to the inter-bay rails. The outer loop 204 includes rails 204a, 204b, 204c, and 204d. The rails 204a and 204c extend in a first direction (e.g., horizontal direction), and the rails 204b and 204d extend in a second direction (e.g., vertical direction) that is substantially perpendicular to the first direction. The inner loop 202 can be used when there are multiple tools along the inner loop 202 that need to be used or even used repeatedly. For example, if a user wants to deposit multiple layers with different patterns onto a wafer, the vehicle can move the wafer along the inner loop 202 to various tools so that the wafer can go through various processing steps. Once the deposition and patterning are complete, the vehicle can transport the wafer out of the inner loop 202 and into another bay for further processing.

Connector rails 220a and 220b can be disposed between the inner loop 202 and the outer loop 204. The connector rails 220a and 220b allow the vehicle to transfer between the inner loop 202 and the outer loop 204. The connector rails 220a and 220b can be diagonally disposed with respect to the inner loop 202 and the outer loop 204 so that the vehicle can more seamlessly transfer rails between the outer loop 204 and the inner loop 202.

The tools 206 can include wafer processing tools (e.g., photolithography tools, etching tools, deposition tools, etc.), die preparation tools (e.g., die cutting tools, wafer bonding and stacking tools, etc.), integrated circuit (IC) packaging tools (e.g., wire bonding tools, IC encapsulation tools, etc.), etc. The vehicle can travel around the FAB to the various tools 206 using the AMHS 200.

The arrows 208 show the direction(s) in which the vehicle can move along the AMHS 200. However, embodiments are not limited thereto, and the vehicle can move in different directions in the AMHS 200. Furthermore, even though arrows indicate various ways that the vehicle can move within the AMHS 200, the vehicle can still move in another direction as long as the AMHS 200 allows the vehicle. For example, if the vehicle is coming from a first bay toward a second bay with one or more intermediary bays disposed therebetween, the vehicle does not need to move through the intermediary bays. For example, the vehicle can pass through the intermediary bays, depending on embodiments.

Figure 3A:
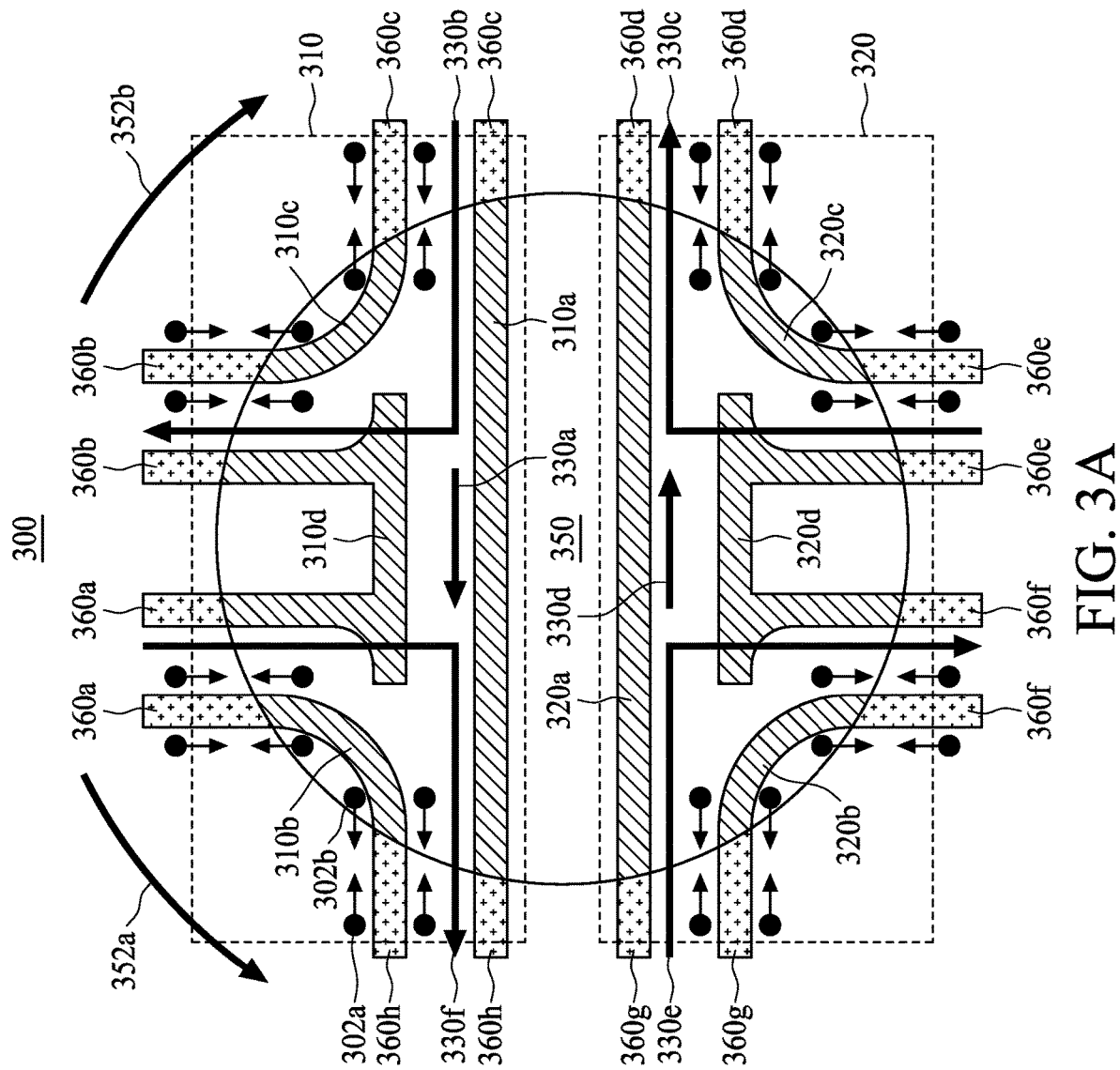
FIG. 3A illustrates a top view of an example hash rail, in accordance with some embodiments.

FIG. 3A illustrates a top view of a hash rail 300, in accordance with some embodiments. The hash rail 300 can be disposed (or fixed) on a turn table 350 and include a first portion 310 (e.g., a pi-shaped rail) and a second portion 320. There can be a plurality of sensors 302 disposed along the hash rail 300.

The turn table 350 can have a circular shape and rotate about an axis that is perpendicular (or substantially perpendicular or orthogonal or substantially orthogonal) to a major surface of the turn table 350. For example, the turn table 350 can rotate in a direction that is clockwise 352*b* and/or counterclockwise 352*a*, depending on the situation. When the turn table rotates clockwise 352*b* or counterclockwise 352*a* by about 90 degrees from a position as shown in FIG. 3A, the resulting hash rail 300 can be as shown in FIG. 3B.

Each of the first portion 310 and the second portion 320 can include rails that are arranged in the shape of the Greek letter π (pi-shape). For example, the first portion 310 can include a straight portion 310*a*, a first curved portion 310*b*, a second curved portion 310*c*, and a center portion 310*d* which collectively form a pi-shape. Similarly, the second portion 320 can include a straight portion 320*a*, a first curved portion 320*b*, a second curved portion 320*c*, and a center portion 320*d* which collectively form a pi-shape.

The first portion 310 and the second portion 320 can align with fixed rails 360*a*, 360*b*, 360*c*, 360*d*, 360*e*, 360*f*, 360*g*, and 360*h* (collectively 360*a*-360*h*). For example, the fixed rail 360*a* can align with the first curved portion 310*b* and the center portion 310*d*, the fixed rail 360*b* can align with the center portion 310*d* and second curved portion 310*c*, the fixed rail 360*c* can align with the second curved portion 310*c* and straight portion 310*a*, the fixed rail 360*d* can align with the straight portion 320*a* and the second curved portion 320*c*, the fixed rail 360*e* can align with the second curved portion 320*c* and the center portion 320*d*, the fixed rail 360*f* can align with the center portion 320*d* and the first curved portion 320*b*, the fixed rail 360*g* can align with the first curved portion 320*b* and the straight portion 320*a*, and the fixed rail 360*h* can align with the straight portion 310*a* and the first curved portion 310*b*. Accordingly, the vehicle that is moving towards the hash rail 300 from any one of the fixed rails 360*a*-360*h* can move through the hash rail 300 to any one of the other rails 360*a*-360*h*.

The controller can control the vehicle and/or the hash rail 300 to cause the vehicle to move through the hash rail 300 in a variety of directions. For example, the vehicle that approaches the hash rail 300 from the fixed rail 360*a* can change directions (or turn) by moving through the first curved portion 310*b* and center portion 310*d* and move towards the fixed rail 360*h* (direction 330*f*). The vehicle that approaches the hash rail 300 from the fixed rail 360*c* can change directions by moving through the second curved portion 310*c* and the center portion 310*d* and move towards the fixed rail 360*b* (direction 330*b*). The vehicle that approaches the hash rail 300 from the fixed rail 360*e* can change directions by moving through the second curved portion 320*c* and the center portion 320*d* and move towards the fixed rail 360*d* (direction 330*c*). The vehicle that approaches the hash rail 300 from the fixed rail 360*g* can change directions (turn) by moving through the first curved portion 320*b* and the center portion 320*d* and move towards the fixed rail 360*f* (direction 330*e*). Although not shown, in some embodiments, the center portion 310*d* can be extended to be aligned with the fixed rail 360*c* and the fixed rail 360*h*, and the center portion 320*d* can be extended to be aligned with the fixed rail 360*d* and the fixed rail 360*g* so that the vehicle can move through the hash rail 300 smoothly.

In some embodiments, the controller can determine that the vehicle approaching the hash 300 from the fixed rail 360*c* can direct the vehicle to go straight through the hash rail 300 by moving along the straight portion 310*a* towards the fixed rail 360*h*. In some embodiments, the controller can determine that the vehicle approaching the hash 300 from the fixed rail 360*g* can direct the vehicle to go straight through the hash rail 300 by moving along the straight portion 320*a* towards the fixed rail 360*d*. In some embodiments, the extended portions of the center portion 310*d* and center portion 320*d* can be retracted, moved or disconnected, so that the vehicle can move through the straight portion 310*a* and the straight portion 320*a*.

Accordingly, the vehicle can switch directions and reach its destination more quickly than typical systems because the vehicle does not need to go around loops (both in the intra-bay and the inter-bay) unnecessarily. Accordingly, the vehicle does not need to make unnecessary detours around intra-bays or inter-bays in order to arrive at destination. This can help save time and increase yield of semiconductor devices at the FAB.

The sensors 302*a* and 302*b* are examples of sensors 302 that are disposed along the hash rail 300 and the fixed rails 360*a*-360*h*. For example, each of the portions 310*a*-310*c*, 320*a*-320*c*, and fixed rails 360*a*-360*h* are shown to include 2 or 4 alignment sensors that are similar to the alignment sensors 302*a* and 302*b*. In some embodiments, there can be additional sensors (e.g., geospatial sensor) that can keep track of the movement and location of the vehicle within the AMHS. In some embodiments, there can be a counting sensor installed on the hash rail 300 so that the counting sensor can keep track of the number of vehicles that have passed the hash rail 300. The sensed data can be transmitted back to the controller so that the controller can monitor the movement of the vehicles operating within the FAB and control their movement and operations as well as the hash rails (e.g., hash rail 300) within the FAB. However, embodiments are not limited thereto, and there can be more or fewer alignment, geospatial, or counting sensors on the hash rail 300 and/or fixed rails 360*a*-360*h*.

The sensors 302*a* and 302*b* can include alignment sensors that assist with the alignment of the turn table 350 with the fixed rails 360*a*-360*h* so that the vehicle moving through the hash rail 300 does not collide with a fixed rail 360*a*-360*h* and other hash rails, or fall off the hash rail 300 or fixed rails 360*a*-360*h*. For example, alignment sensor 302*a* can be fixed to the fixed rail 360*h*, and the alignment sensor 302*b* can be fixed to curved portion 310*b*. Similar alignment sensors can be fixed to the fixed rails 360*a*-360*h* and the first and second portions 310 and 320, as shown in FIG. 3A. When the turn table 350 rotates about the axis, the hash rail 300 can rotate along with the turn table 350. In order for the turn table 350 to stop at the correct angle, the alignment sensors 302*a* and 302*b* can sense (or detect) a distance between the alignment sensors 302*a* and 302*b*. If the distance is equal to or less than a predetermined threshold, the controller can stop the rotation of the turn table 350 and safely allow the vehicle to continue moving through the hash rail 300 without concern that the hash rail 300 will collide or get damaged. If the controller determines that the distance between the alignment sensors 302*a* and 302*b* is above the predetermined threshold, the turn table 350 can continue to rotate until the distance is equal to or less than the predetermined threshold.

In addition to sensing or measuring the distance, the alignment sensors 302a and 302b can also use any suitable sensing mechanism to determine that the turn table 350 is rotated the correct amount. For example, the alignment sensors 302a and 302b can detect whether there is any offset between them along a reference axis. For example, the alignment sensor 302a can have an imaginary reference axis that extends in the same direction as the fixed rail 360h. If the alignment sensor 302b is not disposed within the reference axis, the controller can determine that the turn table 350 has not rotated enough and needs to continue rotating.

The controller (not shown) can receive the sensed data from the alignment sensors 302a and 302b, geospatial sensors, counting sensors, and other suitable sensors. The controller can be a server including one or more processors that are configured to receive the sensed data. Furthermore, the controller and/or a server can receive the sensed data and process the sensed data to use as trained data for a machine learning algorithm (e.g., in an AMHS that uses artificial intelligence). The machine learning algorithm can use the data to predict when the turn table must be rotated and how many degrees. Once the prediction is made, the controller and/or server can control a particular turn table(s) to rotate a predicted number of degrees well before the vehicles arrive at the particular turn table and hash rail so that the vehicles can continue moving at an optimal speed along the fixed and hash rails. If the controller and/or server detects (through the sensors) slowing of the vehicles, traffic jams, and/or other undesirable behavior within the AMHS, the controller and/or server can further train the machine learning algorithm with the newly sensed data and optimize the machine learning algorithm further.

FIG. 3B illustrates a top view of the hash rail 300 of FIG. 3A rotated by about 90 degrees, in accordance with some embodiments. Repeated discussions regarding the hash rail 300 is omitted for simplicity and clarity. The hash rail 300 can rotate (e.g., by about 90 degrees) so that a vehicle approaching the hash rail 300 from the fixed rail 360e can move through the hash rail 300 towards the fixed rail 360b (direction 330g), and a vehicle approaching the hash rail 300 from the fixed rail 360a can move through the hash rail 300 towards the fixed rail 360f (direction 330h). Accordingly, the vehicle can move through the hash rail 300 without unnecessarily traveling around the FAB through loops and different bays in order to arrive at its next tool/destination.

FIG. 4A illustrates a top view of a hash rail 400 and surrounding fixed rails 412a, 412b, 414a, 414b, 416a, 416b, 418a, and 418b, in accordance with some embodiments. The hash rail 400 is similar to the hash rail 300 of FIGS. 3A and 3B, except that the network of rails includes inner track portions 402, 404, 406, and 408. For example, the hash rail 400 includes a plurality of rails that form a pi-shape, or a first portion (e.g., first portion 310) and a second portion (e.g., second portion 320) that form pi-shapes. Also, the hash rail 400 allows a vehicle approaching the hash rail 400 from one of the fixed rails to either change directions or go straight through the hash rail 400. Further, the hash rail 400 and the surrounding fixed rails can include a plurality of alignment sensors that can detect whether the hash rail 400 is aligned with the fixed rails surrounding the turn table on which the hash rail 400 is fixed. Accordingly, similar descriptions are omitted for simplicity and clarity.

Inner track portions 402-408 can be portions of inner loops (e.g., inner loop 202). The inner track portion 402 can be connected to fixed rails 412a and 412b such that a vehicle moving towards the hash rail 400 on the fixed rail 412a can turn around via the inner track portion 402 and move towards the fixed track 412b and away from the hash rail 400. Similarly, the inner track portion 404 can be connected to fixed rails 414a and 414b such that a vehicle moving towards the hash rail 400 on the fixed rail 414a can turn around via the inner track portion 404 and move towards the fixed track 414b and away from the hash rail 400. The inner track portion 406 can be connected to fixed rails 416a and 416b such that a vehicle moving towards the hash rail 400 on the fixed rail 416a can turn around via the inner track portion 406 and move towards the fixed track 416b and away from the hash rail 400. The inner track portion 408 can be connected to fixed rails 418a and 418b such that a vehicle moving towards the hash rail 400 on the fixed rail 418a can turn around via the inner track portion 408 and move towards the fixed track 418b and away from the hash rail 400.

For example, the inner track portions 402 and 406 can allow a vehicle that is approaching the hash rail 400 to turn around (e.g., U-turn) before the vehicle can reach the hash rail 400. Accordingly, the vehicle can be prevented from being damaged or colliding with the hash rail 400. On the other hand, when the vehicle is approaching the hash rail 400 from the fixed rail 414a or 418b, the vehicle can either turn around or go straight through the hash rail 400 to an opposing end of the hash rail 400. For example, if the vehicle approaches the hash rail 400 from the fixed rail 414a, depending on where the vehicle should go, the vehicle can either turn around via the inner track portion 404 or go through the hash rail 400 towards the fixed rail 418a. Accordingly, depending on where the vehicle's destination is, the inner track portions 402, 404, 406, and 408 can allow the vehicle to turn around before the vehicle reaches the hash rail 400 or go straight through the hash rail 400 to the opposing end.

FIG. 4B illustrates a top view of the hash rail 400 of FIG. 4A rotated by about 90 degrees, in accordance with some embodiments. In FIG. 4B, the inner track portions 404 and 408 can allow a vehicle that is approaching the hash rail 400 to turn around (e.g., U-turn) before the vehicle can reach the hash rail 400. On the other hand, when the vehicle is approaching the hash rail 400 from the fixed rail 412a or 416b, the vehicle can either turn around or go straight through the hash rail 400 to an opposing end of the hash rail 400. For example, if the vehicle approaches the hash rail 400 from the fixed rail 412a, depending on where the vehicle should go, the vehicle can either turn around via the inner track portion 402 or go through the hash rail 400 towards the fixed rail 416a. Accordingly, depending on where the vehicle's destination is, the inner track portions 402, 404, 406, and 408 can allow the vehicle to turn around before the vehicle reaches the hash rail 400 or go straight through the hash rail 400 to the opposing end.

Figure 5A:
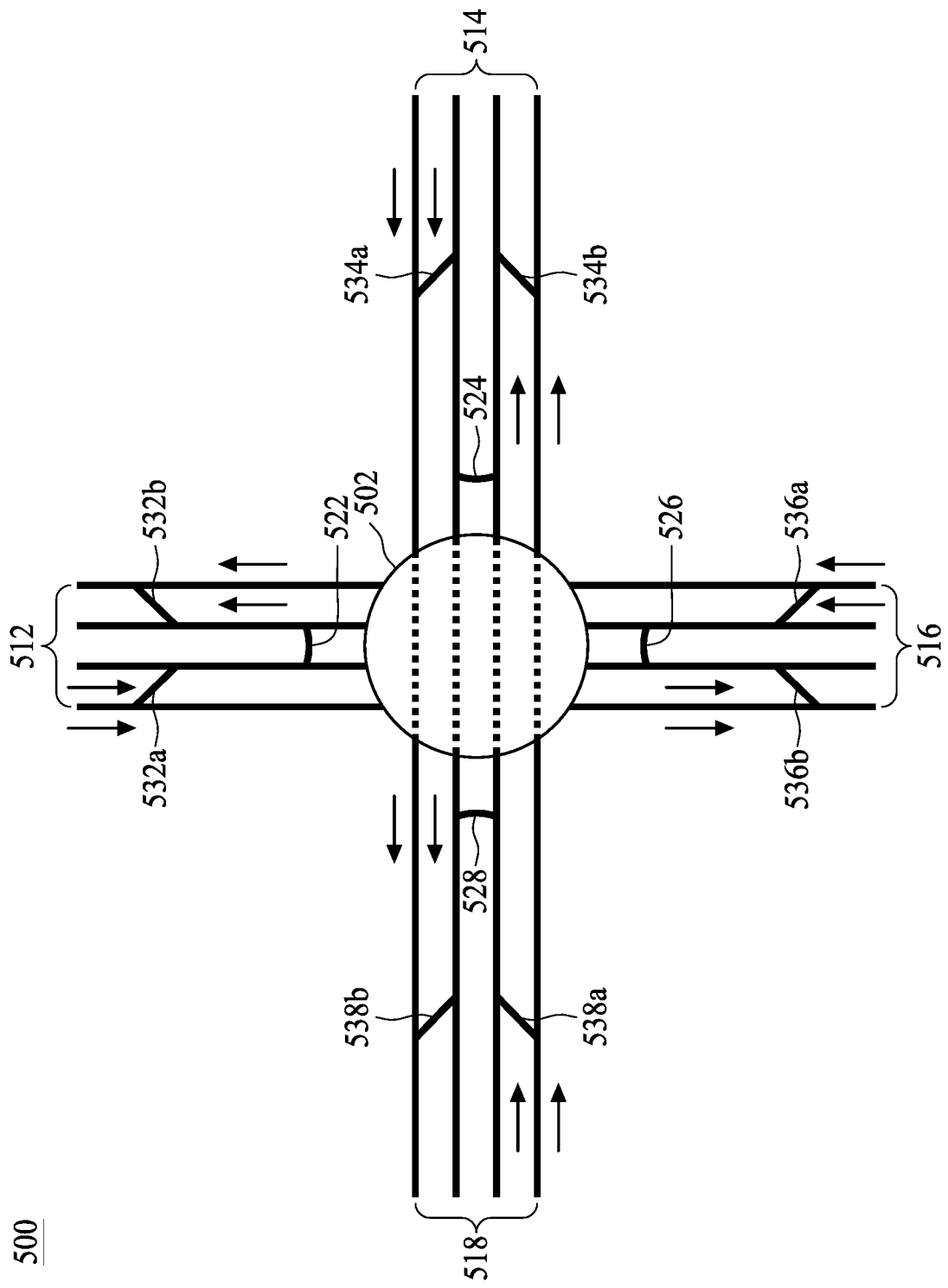
FIG. 5A illustrates a top view of an example AMHS including an example hash rail, in accordance with some embodiments.

FIG. 5A illustrates a top view of an AMHS 500 including a hash rail 502, in accordance with some embodiments. The AMHS 500 includes a plurality of fixed rails 512, 514, 516, and 518 (similar to the fixed rails 360a-360h, 412a-418b) and the hash rail 502 (similar to the hash rail 300 and 400) fixed on a turn table (similar to the turn table 350). The AMHS 500 also includes inner track portions 522, 524, 526, and 528 (similar to the inner track portions 402-408). The AHMS 500 can also include connector (e.g., diagonal) portions 532a, 532b, 534a, 534b, 536a, 536b 538a, and 538b that connect the one portion of a fixed rail to another portion of the same fixed rail, as shown in FIG. 5A. Each of the fixed rails 512-518, the inner track portions 522-528, and the connector portions 532a-538b can include one rail or two rails in parallel, depending on the type of vehicle that is being used in the AMHS 500.

In some embodiments, if the vehicle is heading towards the hash rail 502 from the leftmost fixed rail portion of the fixed rail 512, the vehicle can move to a second leftmost fixed rail portion of the fixed rail 512 by taking the connector portion 532a. The arrows indicate the direction in which the vehicle can move. Although a certain simplified diagram is shown for hash rail 502, this is for illustration purposes only, and the hash rail 502 can be similar to the hash rail 300 or 400. For example, in some embodiments, a vehicle approaching the hash rail 502 along the fixed rail 512 can turn to the fixed rail 518 via the hash rail 502. Accordingly, the hash rail 502 can be implemented in a 4-rail AMHS 500.

As discussed above with respect to hash rails 300 and 400, hash rail 502 can similarly be rotated about an axis that is substantially perpendicular (or orthogonal) to a major surface of the turn table on which the hash rail 502 is fixed. When this happens, a vehicle moving along the fixed rail 514 can move through the hash rail 502 and onto the fixed rail 518. Alternatively, the vehicle can also turn so that the vehicle moves along the fixed rail 512.

In some embodiments, a user may wish for a vehicle to moving along the fixed rail 514 towards the hash rail 502 to go to the fixed rail 516. In such situations, the vehicle can move to the hash rail 512 and stop. Then the hash rail 502 rotate so that the vehicle can face the fixed rail 516. Once the hash rail 502 is aligned properly, the vehicle can resume moving and move along the fixed rail 516.

Figure 5B:
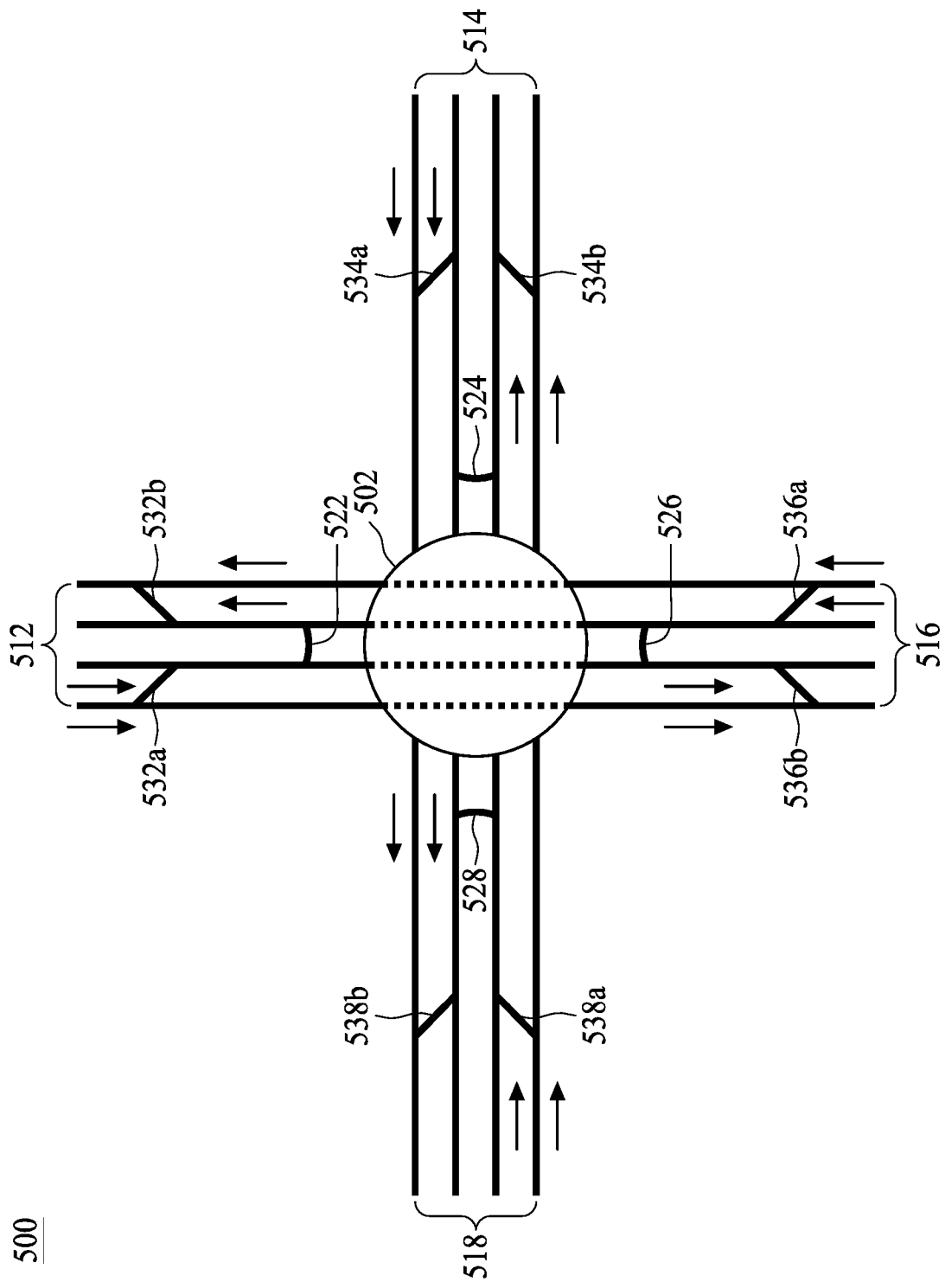
FIG. 5B illustrates a top view of the AMHS and the hash rail of FIG. 5A rotated by about 90 degrees, in accordance with some embodiments.

FIG. 5B illustrates a top view of the AMHS 500 and the hash rail 502 of FIG. 5A rotated by about 90 degrees, in accordance with some embodiments. As discussed above with respect to hash rails 300 and 400, hash rail 502 can similarly be rotated about an axis that is substantially perpendicular (or orthogonal) to a major surface of the turn table on which the hash rail 502 is fixed. When this happens, a vehicle moving along the fixed rail 514 can move through the hash rail 502 and onto the fixed rail 518.

Figure 6A:
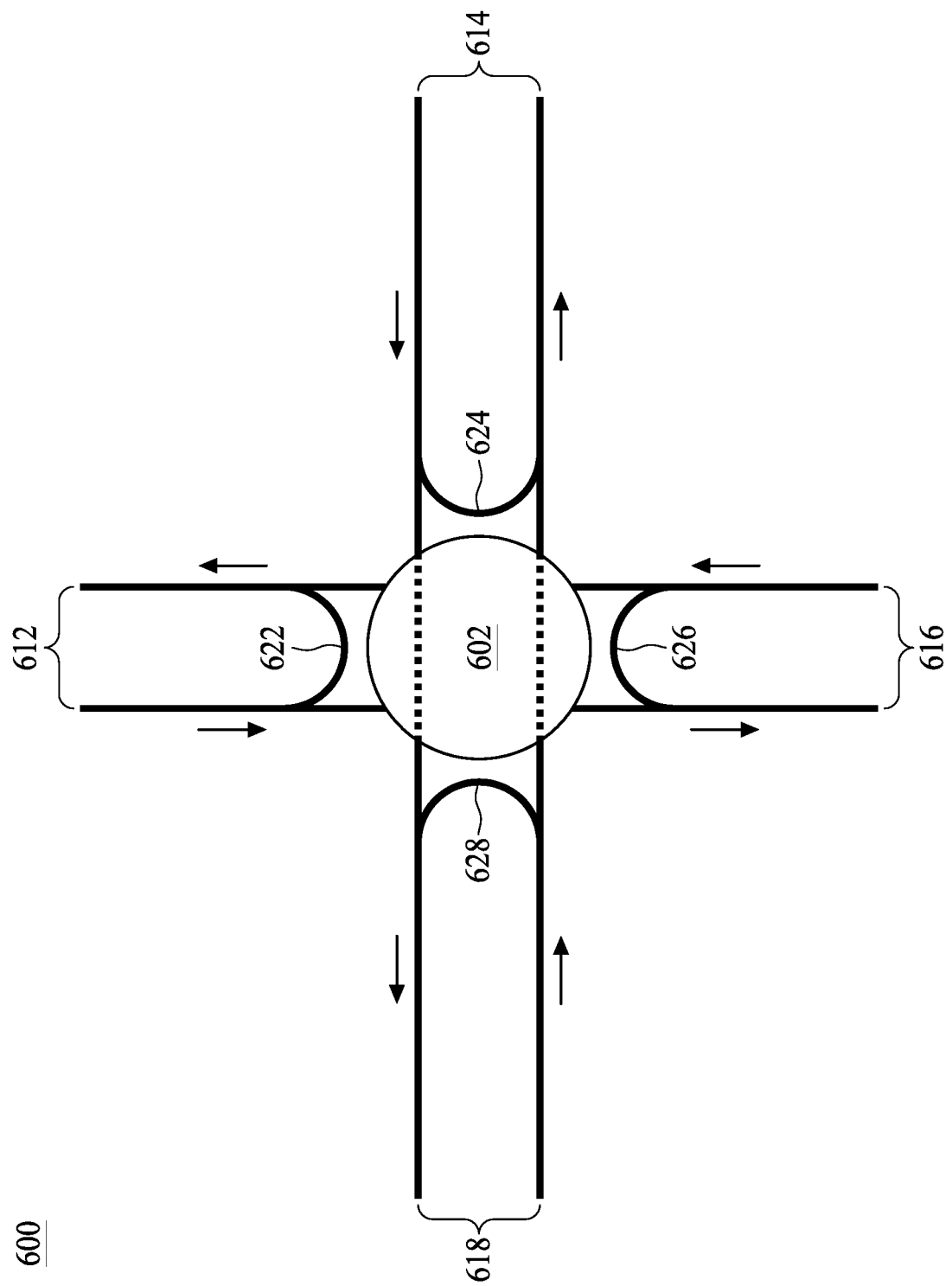
FIG. 6A illustrates a top view of an example AMHS including an example hash rail, in accordance with some embodiments.

FIG. 6A illustrates a top view of an AMHS 600 including a hash rail 602, in accordance with some embodiments. The AMHS 600 and the hash rail 602 are similar to the AMHS 500 and the hash rail 502 except that the AMHS 600 includes a 2-rail system rather than a 4-rail system. For example, the AMHS 600 includes a plurality of fixed rails 612, 614, 616, and 618 (similar to the fixed rails 360a-360h, 412a-418b) and the hash rail 602 (similar to the hash rail 300 and 400) fixed on a turn table (similar to the turn table 350). The AMHS 600 also includes inner track portions 622, 624, 626, and 628 (similar to the inner track portions 402-408). The arrows indicate the direction in which the vehicle can move. However, there are no connector portions like connector portions 532a-538b. Although a certain simplified diagram is shown for hash rail 602, this is for illustration purposes only, and the hash rail 602 can be similar to the hash rail 300 or 400. For example, in some embodiments, a vehicle approaching the hash rail 602 along the fixed rail 612 can turn to the fixed rail 618 via the hash rail 602. Accordingly, the hash rail 602 can be implemented in a 2-rail AMHS 600. Each of the fixed rails 612-618 and the inner track portions 622-628 can include one rail or two rails in parallel, depending on the type of vehicle that is being used in the AMHS 600.

Figure 6B:
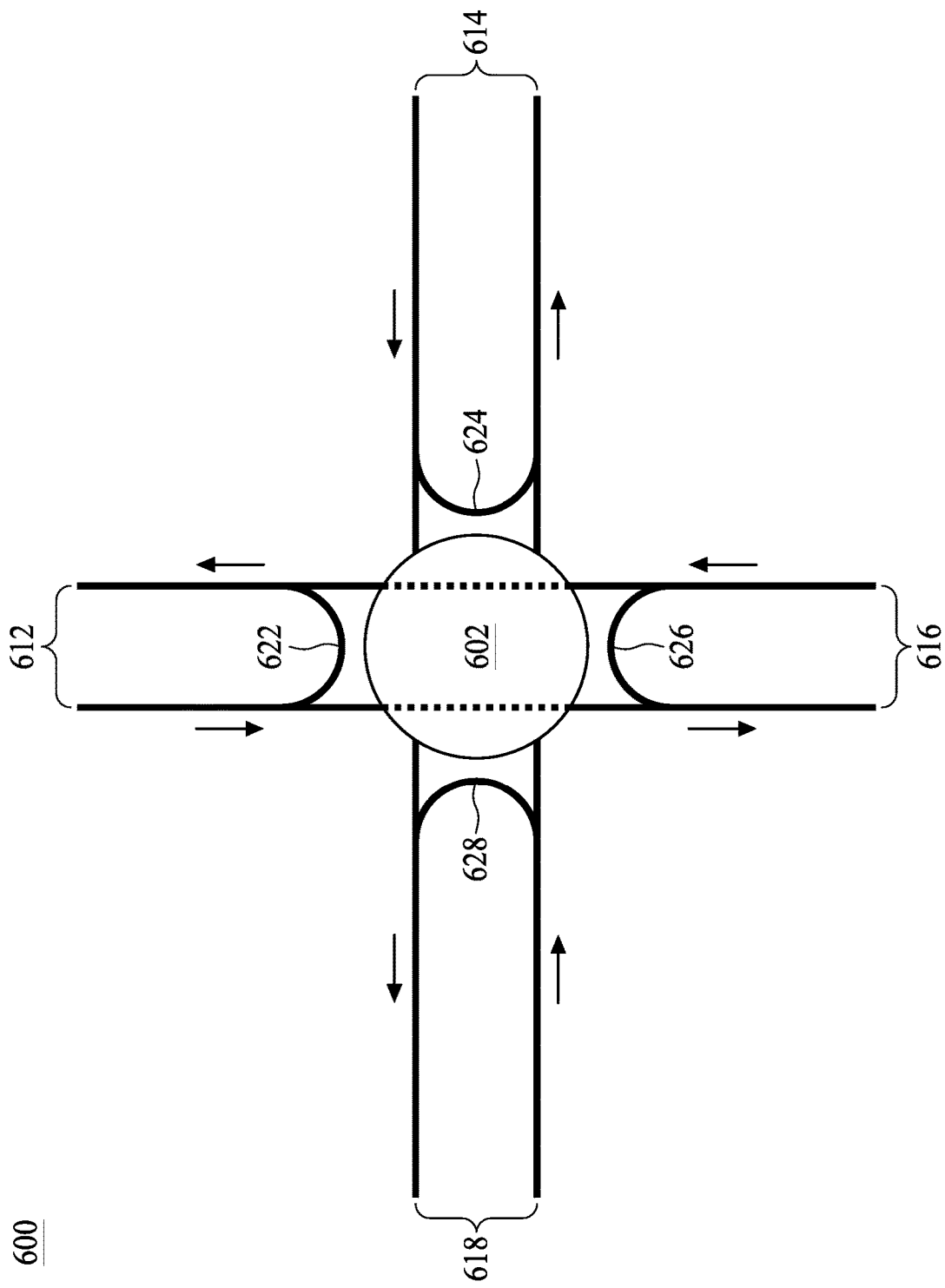
FIG. 6B illustrates a top view of the AMHS and the hash rail of FIG. 6A rotated by about 90 degrees, in accordance with some embodiments.

FIG. 6B illustrates a top view of the AMHS 600 and the hash rail 602 of FIG. 6A rotated by about 90 degrees, in accordance with some embodiments. As discussed above with respect to hash rails 300 and 400, hash rail 602 can similarly be rotated about an axis that is substantially perpendicular (or orthogonal) to a major surface of the turn table on which the hash rail 602 is fixed. When this happens, a vehicle moving along the fixed rail 614 can move through the hash rail 602 and onto the fixed rail 618.

Figure 7B:
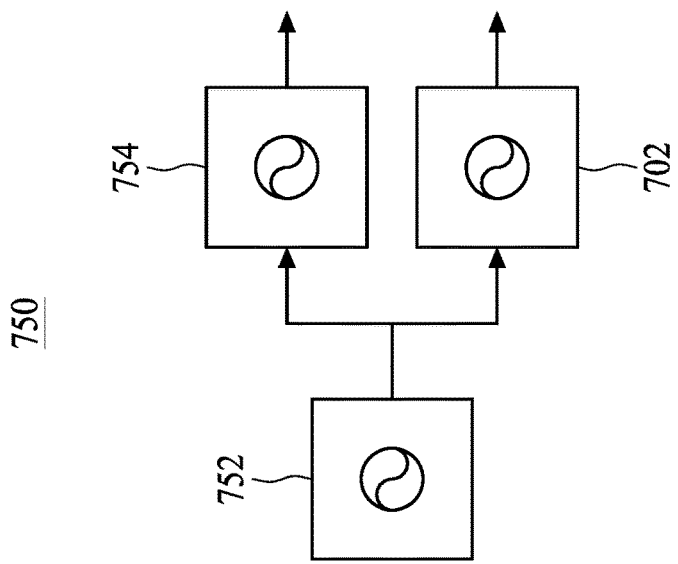
FIG. 7B illustrates a schematic of an example panel system used to power the vehicle, in accordance with some embodiments.
Figure 7A:
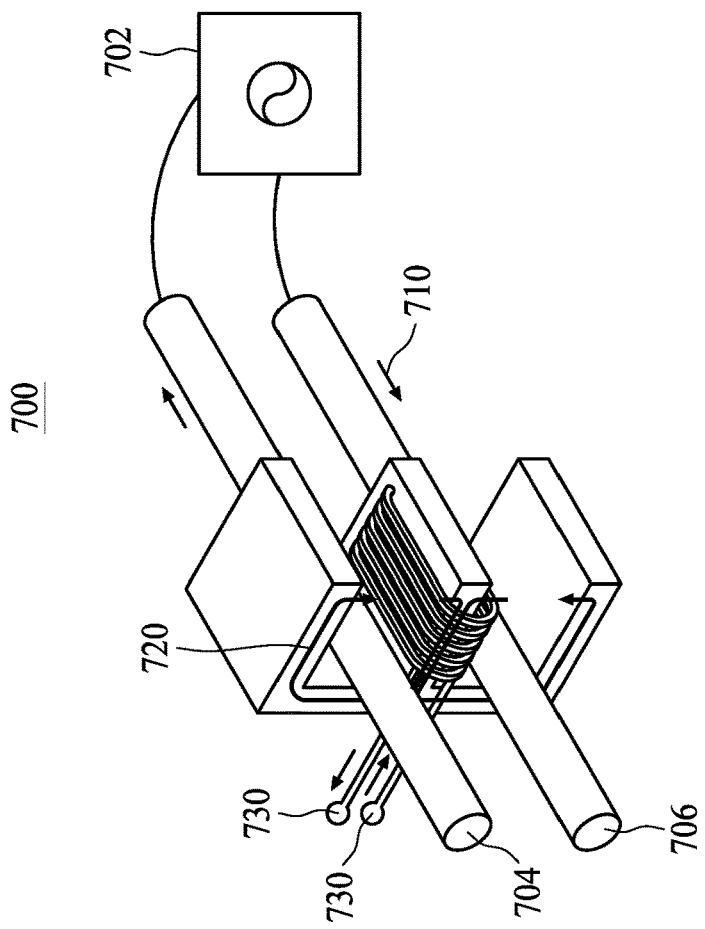
FIG. 7A illustrates a three-dimensional diagram of an example power supply for a hash rail, in accordance with some embodiments.

FIG. 7A illustrates a three-dimensional diagram of a power supply 700 for a hash rail, in accordance with some embodiments. The power supply 700 can be an independent contactless power supply that is separate from a power supply that powers a vehicle moving through the fixed rails. The power supply 700 includes a power supply panel 702 that is able to provide power through induction cables 704 and 706 via electromagnetic induction (710). A magnetic field is generated around the induction cables 704 and 706 in order to efficiently transmit electric power to the vehicles (720). Pickup coils 730 installed on the side of the vehicle opposite the induction cables 704 and 706 can receive an electric power from the magnetic field. The pickup coils 730 are connected to a power receiver that provides electric power to the vehicle itself. Accordingly, the disclosed hash rail can be powered independently from a different power supply than the fixed rails and therefore allow the operation of the hash rail to be safe and reliable.

FIG. 7B illustrates a schematic of a panel system 750 used to power the vehicle, in accordance with some embodiments. The panel system 750 can include a power supply panel 752 that is connected to a central power supply for a building. Then the power supply panel 752 can provide power to a first power supply panel 754 that can power the vehicle in the fixed rails and a second power supply panel 702 that can power the vehicle in the hash rail. Accordingly, power can be provided to the hash rail by using a separate power supply panel to increase safety for the vehicle that moves along the fixed rails and the hash rail.

Figure 8:
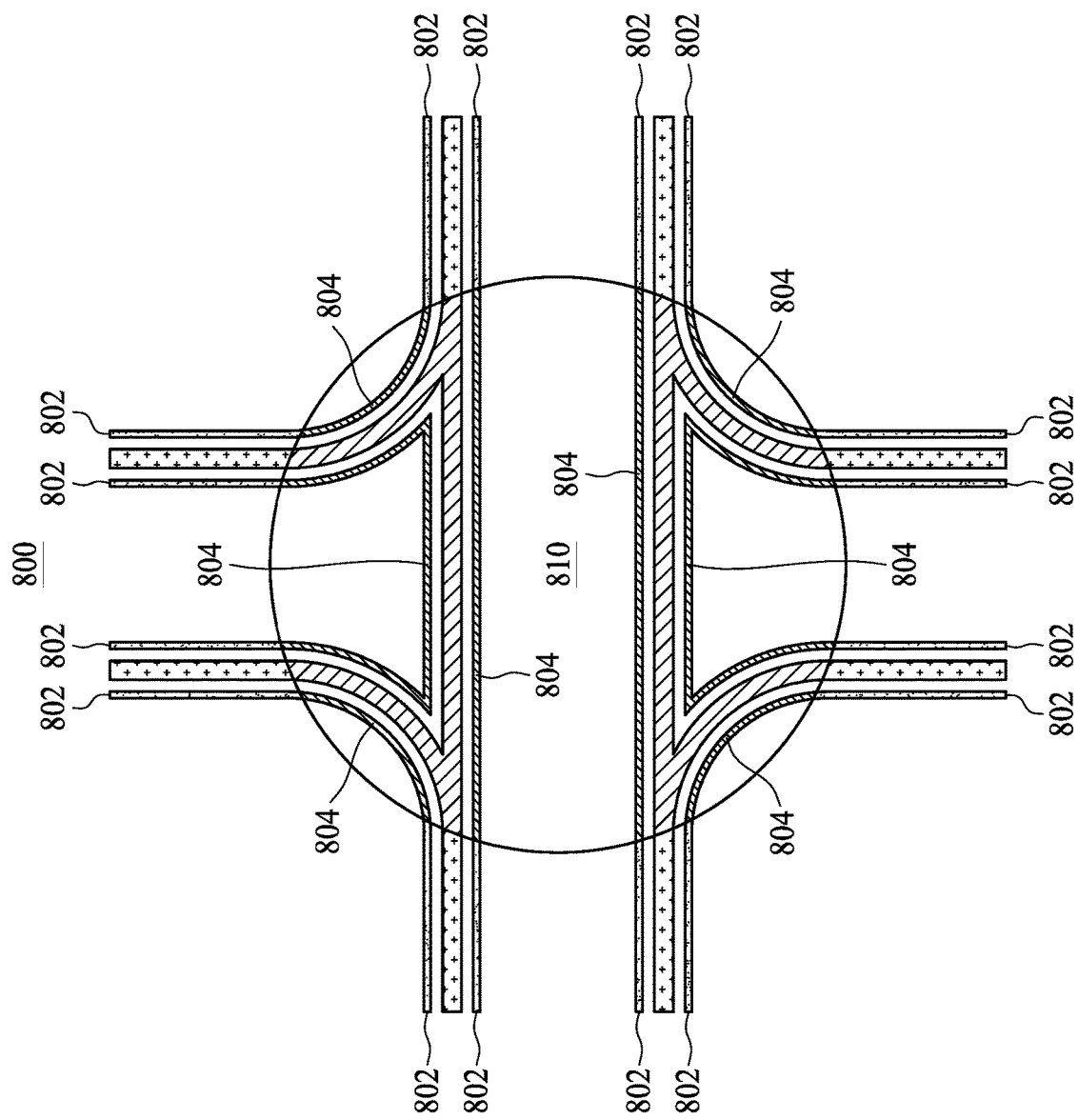
FIG. 8 illustrates a schematic layout diagram of an example hash rail, in accordance with some embodiments.

FIG. 8 illustrates a schematic layout diagram of a hash rail 800, in accordance with some embodiments. The hash rail 800 is similar to the hash rail 300, 400, or 502, and therefore, repeated descriptions are omitted. Accordingly, even though the hash rail 800 has a certain shape and design, embodiments are not limited thereto, and the following description can apply to a 2-rail hash rail or a 4-rail hash rail alike.

A set of induction cables 802 (e.g., induction cables 704 and 706) can be connected to and power the fixed rails, and a set of power coils 804 can be connected to and power the hash rail 800. The induction cables 802 can overlap a turn table 810 that rotates about an axis and onto which the hash rail 800 is fixed. The fixed rails can be connected to a power supply through the induction cables 802, and the hash rail 800 can be connected to another power supply through the induction cables 804. For example, any portion of the hash rail 800 that rotates with the turn table 810 can be connected to a power supply through the power coils 804 so that the turn table 810 can rotate freely. Accordingly, as the turn table 810 rotates about the axis, there is no risk that the induction cables 804 and the induction cables 802 are entangled together to cause any concerns regarding the safety or functionality of the hash rail 800.

Figure 9:
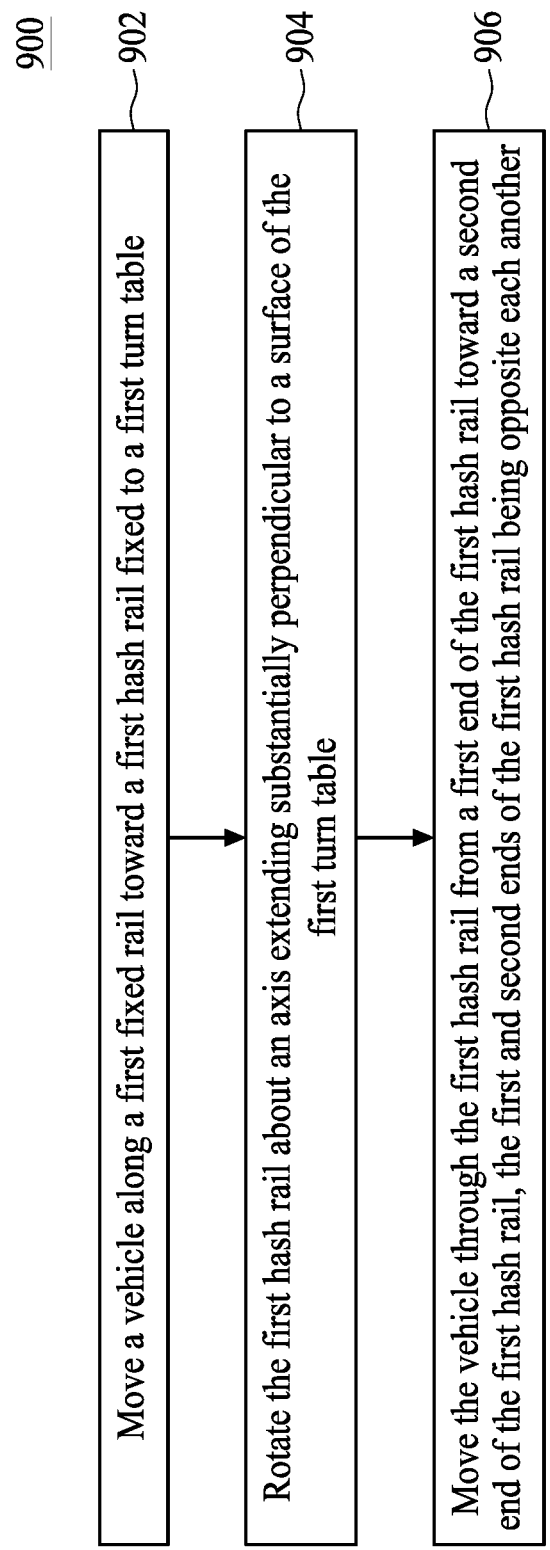
FIG. 9 illustrates a flowchart of an example method of operating an AMHS, in accordance with some embodiments.

FIG. 9 illustrates a flowchart of an example method 900 of operating an AMHS, in accordance with some embodiments. The method 900 may be used to operating AMHS in a FAB that manufactures semiconductor devices. For example, at least some of the operations described in the method 900 may be used to operate the hash rail 300 (FIGS. 3A, 3B) or hash rail 400 (FIGS. 4A, 4B). It is noted that the method 900 is merely an example and is not intended to limit the present disclosure. Accordingly, it is understood that additional operations may be provided before, during, and after the method 900 of FIG. 9, and that some other operations may only be briefly described herein.

In brief overview, the method 900 starts with operation 902 of moving a vehicle along a first fixed rail toward a first hash rail fixed to a first turn table. The method 900 proceeds to operation 904 of rotating the first hash rail about an axis extending substantially perpendicular to a surface of the first turn table. The method 900 proceeds to operation 906 moving the vehicle through the first hash rail from a first end of the first hash rail toward a second end of the first hash rail, the first and second ends of the first hash rail being opposite each another.

Referring to operation 902, the vehicle (e.g., vehicle 100) can move along a fixed rail (e.g., fixed rails 360*a*-360*h*, 412*a*-418*b*, etc.) towards a first hash rail (e.g., hash rail 300, 400, 502). A controller is able to sense the movement of the vehicle and control where the vehicle is going based on the samples that are in the carrier of the vehicle.

Referring to operation 904, the hash rail can rotate about an axis extending substantially perpendicularly to a major surface of the turn table that the hash rail is fixed. The hash rail can be rotated according to the next destination of the next vehicle. For example, if the vehicle is en route to deliver a sample at a particular tool station, the controller can control the turn table to rotate to a predetermined number of degrees such that it will be efficient (or the most efficient) for the vehicle to move to the particular tool station. The rotation is completed before the vehicle reaches the hash rail so that collisions don't occur.

Referring to operation 906, the vehicle can move onto the hash rail and continue to move forward because the controller has determined that the most efficient way for the vehicle to reach the particular tool station is to let it move through the hash rail. Once the vehicle has cleared the hash rail (e.g., moved through the hash rail and is now on a fixed rail past the hash rail), the controller can control the turn table to rotate so that the next vehicle en route to the hash rail can be moved to its destination in the most efficient manner.

Figure 10:
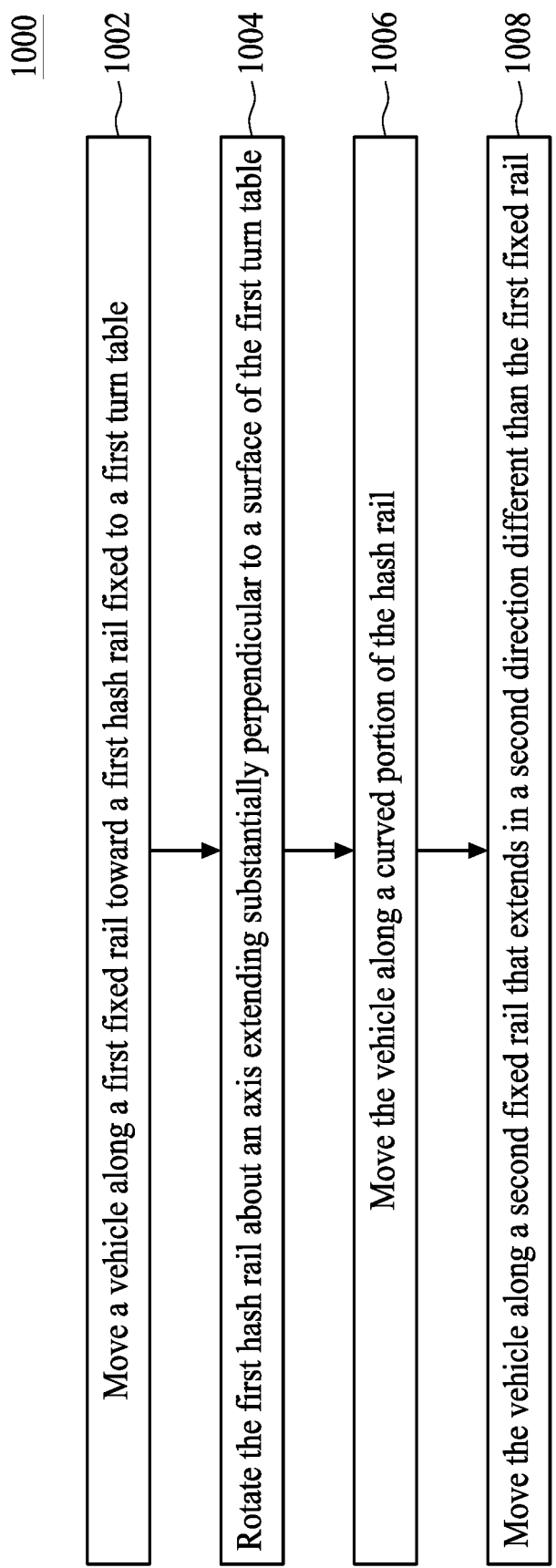
FIG. 10 illustrates a flowchart of another example method of operating an AMHS, in accordance with some embodiments.

FIG. 10 illustrates a flowchart of an example method 1000 of operating an AMHS, in accordance with some embodiments. The method 1000 may be used to operating AMHS in a FAB that manufactures semiconductor devices. For example, at least some of the operations described in the method 1000 may be used to operate the hash rail 300 (FIGS. 3A, 3B) or hash rail 400 (FIGS. 4A, 4B). It is noted that the method 1000 is merely an example and is not intended to limit the present disclosure. Accordingly, it is understood that additional operations may be provided before, during, and after the method 1000 of FIG. 10, and that some other operations may only be briefly described herein.

In brief overview, the method 1000 starts with operation 1002 of moving a vehicle along a first fixed rail toward a first hash rail fixed to a first turn table. The method 1000 proceeds to operation 1004 of rotating the first hash rail about an axis extending substantially perpendicular to a surface of the first turn table. The method 1000 proceeds to operation 1006 of moving the vehicle along a curved portion of the hash rail. The method 1000 proceeds to operation 1008 of moving the vehicle along a second fixed rail that extends in a second direction different than the first fixed rail.

Referring to operation 1002, the vehicle (e.g., vehicle 100) can move along a first fixed rail (e.g., fixed rails 360*a*-360*h*, 412*a*-418*b*, etc.) towards a first hash rail (e.g., hash rail 300, 400, 502). A controller is able to sense the movement of the vehicle and control where the vehicle is going based on the samples that are in the carrier of the vehicle.

Referring to operation 1004, the hash rail can rotate about an axis extending substantially perpendicularly to a major surface of the turn table that the hash rail is fixed. The hash rail can be rotated according to the next destination of the next vehicle. For example, if the vehicle is en route to deliver a sample at a particular tool station, the controller can control the turn table to rotate to a predetermined number of degrees such that it will be efficient (or the most efficient) for the vehicle to move to the particular tool station. The rotation is completed before the vehicle reaches the hash rail so that collisions don't occur.

Referring to operation 1006, the vehicle can move onto a curved portion (e.g., curved portions 310*b*, 310*c*, 320*c*, 320*b*, 320*c*) of the hash rail and change directions because the controller has determined that the most efficient way for the vehicle to reach the particular tool station is to change directions via the hash rail.

Referring to operation 1008, the vehicle can move off the hash rail and onto a second fixed rail that extends in a different direction than the first fixed rail. The vehicle can continue to move along the second fixed rail towards its destination. Once the vehicle has cleared the hash rail (e.g., moved through the hash rail and is now on a fixed rail past the hash rail), the controller can control the turn table to rotate so that the next vehicle en route to the hash rail can be moved to its destination in the most efficient manner.

In one aspect of the present disclosure, AMHS for a FAB is disclosed. The AMHS includes a network of rails and a vehicle configured to hold a sample carrier that stores one or more samples, wherein the vehicle is configured to move within the FAB via the network of rails. The AMHS further includes a turn table connected to the network of rails and configured to rotate about an axis substantially perpendicular to a surface of the turn table, and a hash rail connected to and overlapping the turn table, wherein the hash rail is configured to rotate about the axis with the turn table.

In another aspect of the present disclosure, a method of operating an AMHS is disclosed. The method includes moving a vehicle along a first fixed rail toward a first hash rail fixed to a first turn table, the vehicle configured to hold a sample carrier that stores one or more samples, rotating the first hash rail about an axis extending substantially perpendicular to a surface of the first turn table; and moving the vehicle through the first hash rail from a first end of the first hash rail towards a second end of the first hash rail, the first and second ends of the first hash rail being opposite each another.

In yet another aspect of the present disclosure, a method of operating an AMHS is disclosed. The method includes moving a vehicle along a first fixed rail toward a first hash rail fixed to a first turn table, the vehicle configured to hold a sample carrier that stores one or more samples. The method also includes rotating the first hash rail about an axis extending substantially perpendicular to a surface of the first turn table, moving the vehicle along a curved portion of the hash rail, and moving the vehicle along a second fixed rail that extends in a second direction different than the first fixed rail.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An automated material handling system (AMHS) for a semiconductor fabrication facility (FAB), comprising:
   a network of rails;
   a vehicle configured to hold a sample carrier that stores one or more samples, wherein the vehicle is configured to move within the FAB via the network of rails;
   a turn table connected to the network of rails and configured to rotate about an axis substantially perpendicular to a surface of the turn table; and
   a hash rail connected to and overlapping the turn table, wherein the hash rail is configured to rotate about the axis with the turn table, wherein the hash rail includes a first portion and a second portion each having a pi shape ($\pi$).

2. The AMHS of claim 1, further comprising:
   a first power supply connected to the network of rails; and
   a second power supply connected to the hash rail, wherein the first power supply and second power supply are electrically disconnected from each other.

3. The AMHS of claim 1, wherein each of the first and second portions of the hash rail includes a first curved portion, a second curved portion, and a straight portion connected to ends of the first and second curved portions.

4. The AMHS of claim 1, further comprising a plurality of sensors disposed along at least a portion of the hash rail, wherein the plurality of sensors is configured to sense an alignment of the turn table.

5. The AMHS of claim 1, wherein the network of rails includes:
   a plurality of first rails extending a first direction; and
   a plurality of second rails extending a second direction substantially perpendicular to the first direction,
   wherein the hash rail is disposed between the plurality of first rails and the plurality of second rails.

6. The AMHS of claim 5, wherein the network of rails includes a first inner loop rail disposed between two adjacent first rails of the plurality of first rails, and a second inner loop rail disposed between two adjacent second rails of the plurality of second rails.

7. The AMHS of claim 5, wherein the first rails includes first, second, third, and fourth portions disposed parallel to one another, wherein the vehicle is configured to move along the first and second portions in the first direction, and the vehicle is configured to move along the third and fourth portions in a third direction opposite the first direction,
   wherein the first and second portions are connected to each other through a first diagonal portion, and the third and fourth portions are connected to each other through a second diagonal portion.

8. The AMHS of claim 1, wherein the sample carrier is configured to store one or more wafers having a about 300 mm, about 390 mm, about 400 mm, or about 500 mm radius.

9. A method of operating an automated material handling system (AMHS), comprising:
   moving a vehicle along a first fixed rail toward a first hash rail fixed to a first turn table, the vehicle configured to hold a sample carrier that stores one or more samples;
   rotating the first hash rail about an axis extending substantially perpendicular to a surface of the first turn table; and
   moving the vehicle through the first hash rail from a first end of the first hash rail towards a second end of the first hash rail, the first and second ends of the first hash rail being opposite each another, wherein the first hash rail includes a first portion and a second portion each having a pi shape ($\pi$) that assists the vehicle in changing directions.

10. The method of claim 9, further comprising:
    after moving the vehicle through the first hash rail, moving the vehicle from the second end of the first hash rail to a second fixed rail extending in a first direction;
    moving the vehicle to a second hash rail fixed to a second turn table; and
    moving the vehicle through the second hash rail to a third fixed rail extending in a second direction different than the first direction.

11. The method of claim 9, wherein the first fixed rail includes first and second portions disposed parallel to one another, and wherein the method further comprises, before the vehicle moves to the first hash rail, moving the vehicle from the first portion of the first fixed rail to the second portion of the first fixed rail.

12. The method of claim 9, further comprising:
    supplying power to the first turn table and the first hash rail using a first power supply; and
    supplying power to the first fixed rail using a second power supply, the first and second power supplies being electrically disconnected from each other.

13. The method of claim 9, further comprising:
    sensing, with one or more sensors disposed along at least apportion of the first hash rail, an alignment of the first turn table with respect to the first fixed rail.

14. The method of claim 13, further comprising controlling the turn table and the hash rail using artificial intelligence (AI) based on the sensed alignment.

15. The method of claim 14, further comprising:
    controlling the first turn table, based on the AI, to rotate the first turn table.

16. The method of claim 9, wherein each of the first and second portions of the hash rail includes a first curved portion, a second curved portion, and a straight portion connected to ends of the first and second curved portions.

17. A method of operating an automated material handling system (AMHS), comprising:
    moving a vehicle along a first fixed rail toward a first hash rail fixed to a first turn table, the vehicle configured to hold a sample carrier that stores one or more samples;
    rotating the first hash rail about an axis extending substantially perpendicular to a surface of the first turn table;
    moving the vehicle along a curved portion of the hash rail; and
    moving the vehicle along a second fixed rail that extends in a second direction different than the first fixed rail,
    wherein the first hash rail includes a first portion and a second portion each having a pi shape ($\pi$) that assists the vehicle in changing directions, and wherein the curved portion is part of the pi shape ($\pi$).

18. The method of claim 17, further comprising:
supplying power to the first turn table and the first hash rail using a first power supply; and
supplying power to the first fixed rail using a second power supply, the first and second power supplies being electrically disconnected from each other.

19. The method of claim 17, further comprising:
sensing, with one or more sensors disposed along at least apportion of the first hash rail, an alignment of the first turn table with respect to the first and second fixed rails; and
controlling the turn table and the hash rail using artificial intelligence (AI) based on the sensed alignment.

20. The method of claim 17, wherein the sample carrier is configured to store one or more wafers having a radius of about 300 mm, about 390 mm, about 400 mm, or about 500 mm.

* * * * *